United States Patent [19]

Brower et al.

[11] 4,268,891
[45] May 19, 1981

[54] MULTILAMP PHOTOFLASH UNIT HAVING GROUNDED REFLECTOR

[75] Inventors: Boyd G. Brower, Williamsport; Ronald E. Sindlinger, Muncy; James L. Holmes, Montoursville, all of Pa.

[73] Assignee: GTE Products Corporation, Stamford, Conn.

[21] Appl. No.: 941,875

[22] Filed: Sep. 13, 1978

[51] Int. Cl.³ .............................................. G03B 15/02
[52] U.S. Cl. .................................... 362/11; 354/143; 361/411; 362/13; 362/16
[58] Field of Search ................................. 362/11–17; 354/143; 361/411

[56] References Cited

U.S. PATENT DOCUMENTS

| | | | |
|---|---|---|---|
| 3,725,693 | 4/1973 | Anderson et al. | 362/16 |
| 3,934,336 | 1/1976 | Morse | 361/411 X |
| 4,064,431 | 12/1977 | Cote | 362/13 |
| 4,093,979 | 6/1978 | Kewley | 362/13 |
| 4,104,706 | 8/1978 | Hanson et al. | 362/13 |
| 4,136,375 | 1/1979 | Kewley | 362/13 |
| 4,152,751 | 5/1979 | Sindlinger et al. | 362/13 |
| 4,156,269 | 5/1979 | Armstrong | 362/13 |
| 4,164,007 | 8/1979 | Audesse et al. | 362/13 |
| 4,189,298 | 2/1980 | Shaffer | 431/359 |

Primary Examiner—Harold J. Tudor
Attorney, Agent, or Firm—Edward J. Coleman

[57] ABSTRACT

A photoflash unit comprising a plurality of high-voltage type flashlamps mounted on a printed circuit board containing circuitry for sequentially igniting the flashlamps in response to successive high-voltage firing pulses applied thereto. One lead-in wire of each of the flashlamps is connected to a common circuit conductor. An electrically conductive reflector unit is positioned between the lamps and the circuit board. The reflector unit is grounded to the common circuit conductor by means of a dried paste of conductive material disposed at the interface between the reflector and common conductor. In this manner, the reflector unit functions as an electrostatic shield for the circuitry.

10 Claims, 8 Drawing Figures

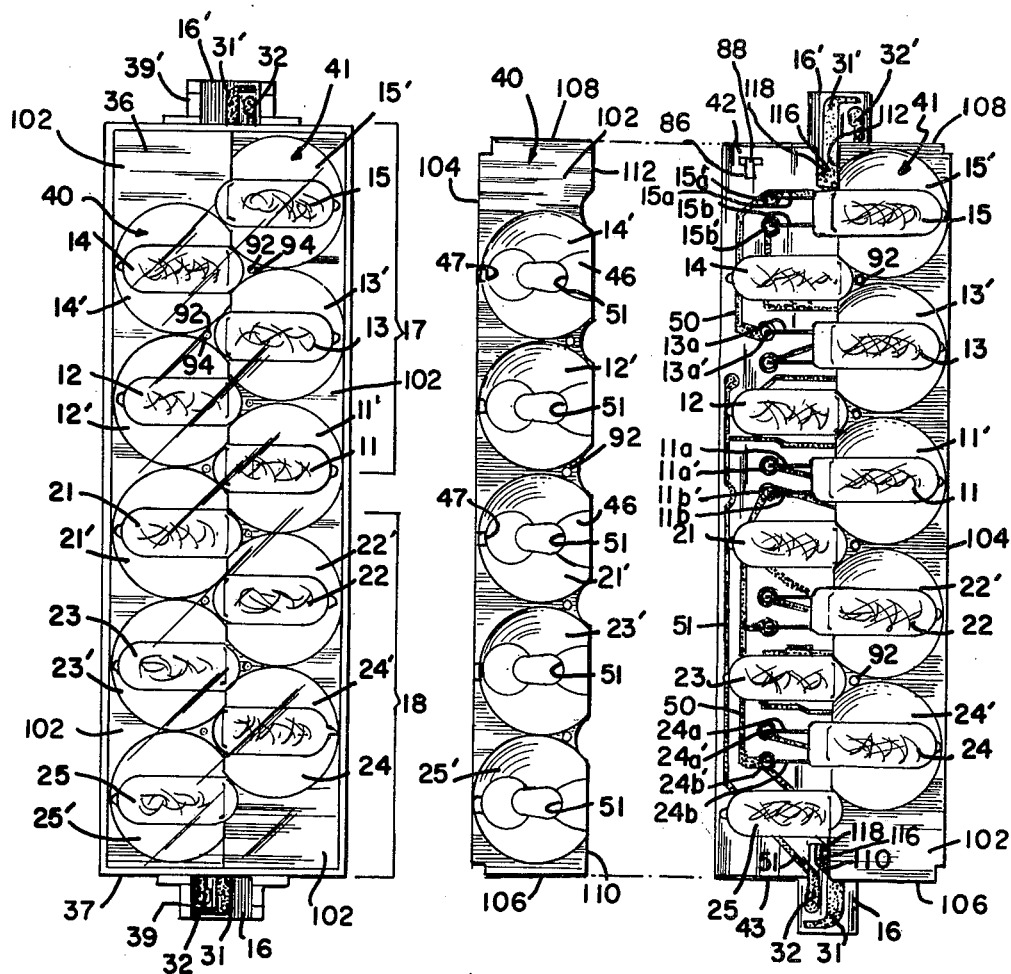
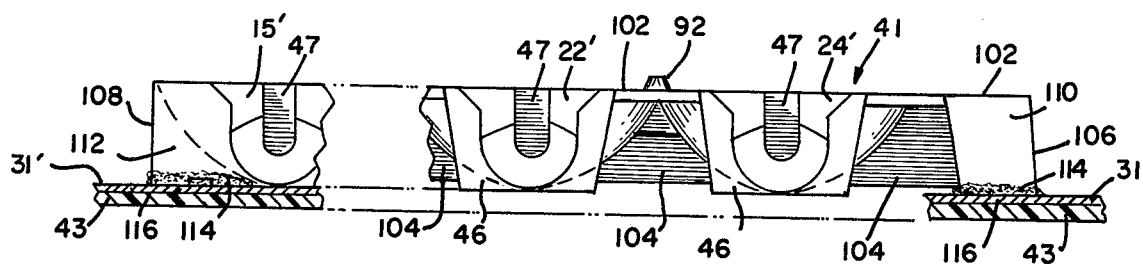

MULTILAMP PHOTOFLASH UNIT HAVING GROUNDED REFLECTOR

CROSS-REFERENCE TO RELATED APPLICATIONS

Ser. No. 840,497, filed Oct. 7, 1977, now U.S. Pat. No. 4,164,007, Emergy G. Audesse et al, "Multilamp Photoflash Unit", assigned the same as this invention.

Ser. No. 840,498, filed Oct. 7, 1977, now U.S. Pat. No. 4,156,267, Donald E. Armstrong, "Multilamp Photoflash Unit", assigned the same as this invention.

Ser. No. 860,759, filed Dec. 15, 1977, now U.S. Pat. No. 4,170,034, Boyd G. Brower, "Multilamp Photoflash Unit With More Reliable Circuit Arrangement", assigned the same as this invention.

Ser. No. 861,652, filed Dec. 19, 1977, now U.S. Pat. No. 4,152,751, Ronald E. Sindlinger et al, "Photoflash Unit With Secured Insulator", assigned the same as this invention.

BACKGROUND OF THE INVENTION

This invention relates to multilamp photoflash units having circuit means for igniting the flashlamps, and more particularly, to high-voltage photoflash array with improved means for providing electrostatic protection.

Numerous multilamp photoflash arrangements with various types of sequencing circuits have been described in the prior art; particularly, in the past few years. A currently marketed photoflash unit (described in U.S. Pat. Nos. 3,894,226; 3,912,442; 3,935,442; 3,937,946; 3,941,992; 3,052,320 and 4,017,728 and referred to as a flip flash) employs high-voltage type lamps adapted to be ignitied sequentially by successively applied high-voltage firing pulses from a source such as a camera-shutter-actuated piezoelectric element. The flip flash unit comprises an elongated planar array of eight high-voltage type flashlamps each having a pair of lead-in wires connected to a printed circuit board by means of eyelets thereon. The circuit board is provided with switching circuitry for causing sequential flashing of the lamps, and an array of respectively associated reflectors are positioned between the lamps and the circuit board. The reflectors for the lamps can be made as a single reflector member shaped to provide multiple individual reflectors for the lamps. The reflector member preferably is electrically conductive, such as being made of metal or metal-coated plastic, and is electrically connected to an electrically "ground" portion of the circuitry on the circuit board; thus, the reflector member functions as an electrical shield reducing the possibility of accidental flashing of the lamps by an electrostatic voltage charge on a person or object touching or near the unit. Such accidental flashing is particularly prone to occur in this instance as the primers used in the high-voltage type flash-lamps employed in such arrays are designed to be highly sensitive toward high-voltage dishcarges. Electrical energies as low as a few microjoules are sufficient to promote ignition of such primers and flashing of the lamps. This high sensitivity is needed in order to provide lamps that will function reliably from the compact and inexpensive piezoelectric sources that are practical for incorporation into modern miniature cameras. Typically, the high voltage pulses provided by the camera are in the order of 500 to 4000 volts.

The use of a conductive reflector unit as an electrostatic shield for the flipflash array is described in the aforementioned U.S. Pat. No. 3,935,442 wherein the reflector is connected to a ground point of the circuit board by means of a conductive U-shaped spring clip which engages a web portion of the reflector unit and extends against a conductive area on the circuit board. This clip-engaged conductive area on the circuit board comprises an enlarged portion of a common circuit conductor which is connected to one lead-in wire of each of the flashlamps. An alternative method of connecting the reflector to a "ground" point of the circuit board is described in the aforementioned U.S. Pat. No. 3,941,992, wherein FIG. 2 thereof shows a wire 77 connected between the metallized reflector and a common run. Both of these reflector grounding methods share a basic deficiency in that initial electrical connection is not always established due to inevitable distortion of the plastic array components during manufacture and assembly. Loss of this mechanical (and electrical) contact renders the lamps of that array subject to unintentional electrostatic flashing.

Another problem found with these grounding methods is that the electrical contact is readily lost under humid conditions, principally because of galvanic corrosion of the thin, aluminized reflector coating at the point of contact. A further disadvantage of the U-clip approach is its compartively higher cost.

Another reflector grounding method, described in U.S. Pat. Nos. 4,093,979 and 4,104,706, places the conductive surface of the reflector as closely as possible to the common circuit conductor. In alternative embodiments, a tab integral with the conductive reflector resiliently engages against the common circuit conductor. U.S. Pat. No. 4,060,721 also describes a reflector arrangement with a resilient tab for grounding. All of these methods of grounding suffer from similar disadvantages to those mentioned above. Further, the approach of bringing the reflector close to the common conductor relies on what is essentially a high voltage spark gap rather than a reliable low voltage path to ground. The resilient tabs pose a problem because of the thinness of the aluminizing. Any flexing of such a thin conductor on the present polystyrene material would cause discontinuities, and the aluminizing deteriorates during humidity tests when it just touches the circuit material.

A copending application Ser. No. 866,262 filed Jan. 2, 1978 now U.S. Pat. No. 4,189,298 and assigned the same as the present invention, provides an improved reflector grounding arrangement in which a pliable, electrically conductive adhesive material bridges the gap between the reflector and common circuit conductor and provides a reliable low voltage connection therebetween. Although advantageous for use in the flip flash units described in the aforementioned patents, the conductive adhesive connection is not as suitable for use with photoflash units of the type described in the cross-referenced copending applications Ser. Nos. 840,497 Audesse et al, 840,498 Armstrong, 860,759 Brower, and 861,652 Sindlinger et al. These cross-referenced applications describe an improved multilamp photoflash unit which more efficiently utilizes a given housing volume and thereby reduces the cost of the unit per flashlamp contained therein. More specifically, a compact lamp arrangement is provided whereby additional lamps are contained in a given volume while maintaining light output performance requirements. In a particular embodiment described, ten lamps are provided in a housing having the same dimensions as the above-discussed eight-lamp flip flash units. The greater compactness is provided by arranging the planar array of lamps in two parallel columns with the tubular envelopes horizontally disposed and with the lamps of one column staggered with respect to the other such that the bases are interdigitated. A pair of reflector panels are aligned with the two columns of lamps and arranged overlie the lamp lead-in wires and bases.

As may well be appreciated, the above-described compact ten-lamp array imposes a significant challenge with respect to packaging design. Also, the circuit must be laid out in a very dense pattern on the lamp mounting surface of the associated circuit board. Another difference in the assembly is that the lamps are mounted for being disposed horizontally in the finished array, whereas in the earlier-mentioned eight-lamp array, the lamps are disposed vertically and respectively assembled in the multiple cavities of a single reflector unit. In the ten-lamp array, the two reflector panels comprise the two halves of the total reflector array and are joined together from each side onto the lamp-circuit board assembly. There is no lamp-fitting hole in each reflector panel since the lamps are positioned directly into the reflector cavities as the panels are positioned onto the circuit board.

With respect to grounding of the conductive reflector to the circuit board common conductor, the conductive surfaces that are connected by conductive adhesive in the eight-lamp arrays lie in parallel planes one above the other. The one-piece reflector is placed on the circuit board before the lamps are bent over. This arrangement, along with the large reflector openings, allows the conductive adhesive to be deposited on both the reflector and circuit board when assembled. In contrast, the two-piece reflector of the ten-lamp array is assembled after the lamps have been bent over. Because of the physical characteristics of the conductive adhesive, it is not feasible to try to deposit it on the reflector and then attempt to assemble the array.

SUMMARY OF THE INVENTION

In view of the foregoing, it is an object of this invention to provide a photoflash unit having an improved means for significantly reducing inadvertent electrostatic flashing of high-voltage lamps contained therein.

A principal object of the invention is to provide an automatable reflector grounding means for compact high voltage photoflash units that provides a more fail safe low-voltage electrical path between the common circuit and the reflector which better withstands exposure to high relative humidity.

Another object is to provide a less costly but more reliable means for grounding a conductive reflector unit to the common circuit run in an assembly having severe spatial constraints.

These and other objects, advantages and features are attained, in accordance with the principals of this invention, by the discovery that a more positive low voltage electrical path between the reflector and common circuit conductor, as well as dramatically improved retention of this electrical path under humid conditions, can be attained in a compact photoflash unit having severe spatial constraints, such as the aforementioned ten-lamp arrays, by disposing a dried paste of electrically conductive material at an interface between the reflector and common circuit conductor. More specifically, the conductive paste may comprise a conduction-promoting particulate material mixed with a binder. In a preferred embodiment of the invention, the composition of this conductive paste is essentially the same as the composition of the conductive circuit pattern on the printed circuit board.

In a preferred method of making the photoflash unit, a circuit paste is prepared by admixing a conduction promoting particulate material, such as mixture of silver flakes and glass beads, with a binder and a quantity of solvent. This circuit paste is silk-screened as a conductive pattern on a surface of the circuit board. The flashlamps are connected to the circuit board and in accordance with the invention, a wet paste of electrically conductive material is applied onto a portion of the electrically conductive reflector unit. The wet paste applied to the reflector preferably comprises the same mixture as the circuit paste with an additional quantity of solvent to provide a thinner consistency for facilitating application to the reflector. The reflector is then positioned between the lamps and circuit board with the wet paste disposed at an interface between the reflector and the common circuit conductor on the circuit board. The paste is then allowed to dry so as to actually join the reflector and common conductor at the interface. This provides a consistent low voltage path therebetween for reliably grounding the reflector. The paste may be allowed to dry before assembly, but best results are obtained if it is wet upon joining components because it then becomes integral with both the reflector and common circuit.

BRIEF DESCRIPTION OF THE DRAWINGS

This invention will be more fully described hereinafter in conjunction with the accompanying drawings, in which:

FIG. 1 is a front elevation of a multilamp photoflash unit;

FIG. 2 is a front elevation of the unit of FIG. 1 with the cover removed and one of the reflector panels separated and spaced to the side to show reflector grounding locations according to the invention;

FIG. 3 is an enlarged fragmentary detail view of a reflector panel, as viewed from the lamp-receiving side, and associated sectional portions of the printed circuit board particularly showing locations of conductive paste for grounding the reflector according to the invention.

DESCRIPTION OF PREFERRED EMBODIMENT

Figure 5:
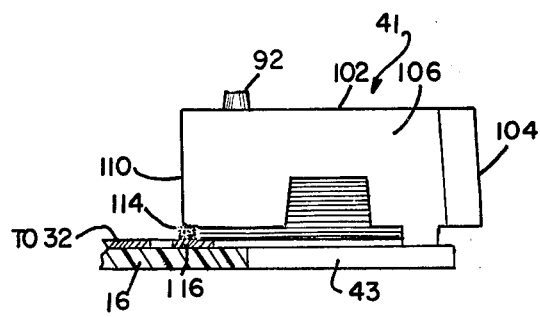
FIG. 5 is an end view of the reflector panel of FIG. 3 along with an associated sectional portion of the printed circuit board.

FIGS. 1 and 2 illustrate a multilamp photoflash unit of the type described in the aforementioned copending application Serial No. 840,497, Audesse et al. This unit is similar in general operation to that described in the aforementioned U.S. Pat. No. 4,017,728, ecept that the construction has been modified to include additional lamps in a housing having the same outer dimensions. Whereas the unit described in the above-mentioned patent included a planar array of eight high voltage type flashlamps (two groups of four) with associated reflector cavities provided in a single reflector member, the illustrated unit comprises a planar array of ten photoflash lamps 11-15 and 21-25 mounted on a printed circuit board 43, with an array of respectively associated reflector cavities 11'-15' and 21'-25' disposed and mounted in two parallel columns, with the lamps of one column staggered relative to the lamps of the other column. Each of the lamps has a pair of lead-in wires 11a, 11b, etc., connected to the printed circuitry on board 43 by respective eyelets 11a' and 11b', etc. The column of the lamps 15, 13, 11, 22, and 24 are positioned with their respective bases interdigitated with the bases of the adjacent column comprising lamps 14, 12, 21, 23 and 25, the bases of one column thereby facing the adjacent column. The reflector cavities are provided on a pair of strip-like panels 40 and 41 which are conveniently separable for assembly purposes, as particularly illustrated in FIG. 2. The array is provided with a plug-in connector tab 16 at the lower end thereof which is adapted to fit into a camera or flash adapter. A second plug-in connector tab 16' is provided at the top end of the unit, whereby the array is adapted to be attached to the camera socket in either of two orientations, i.e., with either the tab 16 or the tab 16' plugged into the socket. The lamps are arranged in two groups of five disposed on the upper and lower halves, respectively, of the elongated, rectagular-shaped array. Upper group 17 comprises lamps 11-15, and lower group 18 includes lamps 21-25; the reflector cavities 11', etc. are disposed behind the respective lamps so that as each lamp is flashed, light is projected forwardly of the array. The lamps are arranged and connected so that when the array is connected to a camera by the connector tab 16 only the upper group 17 of lamps will be flashed, and when the array is turned end for end and connected to the camera by the other connector tab 16', only the then upper group 18 of lamps will be flashed. By this arrangement, only lamps relatively far from the camera lens axis are flashable, thus reducing the undesirable red-eye effect.

Figure 6:
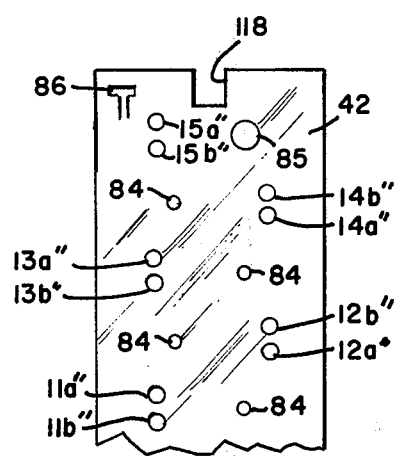
FIG. 6 is a fragmentary front elevation of one end of a sheet of electrically insulating material used in one embodiment of the photoflash unit of FIG. 1

The construction of the array comprises front and back housing members 36 and 37, which preferably are made of plastic and are provided with interlocking members (not shown) which can be molded integrally with the housing members and which lock the housing members together in final assembly to form a unitary flash array structure. In the preferred embodiment shown, the front housing member 36 is a rectangular concavity and the back housing member 37 is substantially flat and includes integral extensions 39 and 39' at the ends thereof which partly surround and protect the connector tabs 16 and 16' and also function to facilitate mechanical attachment to the camera socket. Sandwiched between the front and back housing member 36 and 37, in the order named, are the flashlamps 11, etc., the pair of adjacent strip-like reflector panels 40 and 41 (preferably each being an aluminum-coated plastic molding) shaped to provide the individual reflector cavities 11' etc., a transparent electrically insulating sheet 42 (see, for example, FIGS. 2, 6 and 7), the printed circuit board 43 provided with integral connector tabs 16 and 16', and an indicia sheet (not shown) which may be provided with information and trademarks, and other indicia such as flash indicators located behind the respective lamps and which change color due to heat and/or light radiation from a flashing lamp, thus indicating at a glance which of the lamps have been flashed and not flashed.

Referring to FIG. 2, window means, such as openings 51, are provided in each of the reflector cavities 11', etc., behind the lamp aligned therewith. The circuit board 43 is provided with corresponding openings (not shown) to facilitate radiation from the flashlamps reaching the flash indicators. The rear housing member 37 is transparent (either of clear material or provided with window openings) to permit viewing of the indicia on the indicia sheet. The front housing member 36 is transparent, at least in front of the lamps 11, etc., to permit light from the flashing lamps to emerge forwardly to the array and may be tinted to alter the color of the light from the flashlamps.

The height and width of the rectangular array are substantially greater than its thickness, and the height and width of the reflector panels 40, 41, insulating sheet 42, and circuit board 43 are substantially the same as the interior height and width of the housing member 36 to facilitate holding the parts in place.

The tab 16, which is integral with the circuit board 43, is provided with a pair of electrical terminals 31 and 32, and similarly the tab 16' is provided with a pair of terminals 31' and 32', for contacting terminals of a camera socket for applying firing voltage pulses to the array. The terminals 31 and 31' are shown as having a J-shaped configuration for temporarily shorting the socket terminals while the array is being plugged in, to discharge any residual voltage charge in the firing pulse source and also to reduce the likelihood of lamps being accidentally flashed by electrostatic voltage when the array is handled.

The circuit board 43 has a "printed circuit" thereon for causing sequential flashing of the lamps by firing voltage pulses applied to the terminals 31, 32 or 31', 32'. The printed circuit may be functionally similar to that described in the aforementioned U.S. Pat. Nos. 3,894,226 or 4,017,728 except for extending the circuitry to accommodate an additional lamp in each half of the printed circuit board. A preferred embodiment of the circuitry, however, is that described in the previously referenced copending application Ser. No. 860,759, Brower. The top and bottom halves of the printed circuitry preferably are reverse mirror images of each other. The lead wires 11a, 11b, etc., of the lamp 11 etc., may be attached to the circuit board 43 in various ways such as by means of metal eyelets 11a', etc. placed through openings in the board. The lead wires 11a, 11b, etc., underlie the reflector panels and pass through suitable openings 11a", 11b", etc., in the insulating sheet 42 (FIG. 6) and into or through the respective pairs of eyelets 11a', 11b', etc. The shaks of the eyelets which project from the other side of the board are crimped or bent to hold the lead wires and make electrical contact thereto and also to hold the eyelets in place with their heads in electrical contact with the circuit of the circuit board.

As previously mentioned, the reflector panels 40 and 41 preferably are made of metal-coated plastic so that they are electrically conductive. More specifically, each reflector panel is molded of a plastic material, such as polystyrene, and includes a planar front surface 102 having cavities 11', etc. and openings 51. Each panel further includes a sidewall 104 extending the length of the panel, a pair of end walls 106 and 108, and sidewall portions 110 and 112 at each end of the lamp receiving side of the reflector panel. The entire panel structure is thin-walled, and the reflector surface of each cavity basically comprises a parabaloid of revolution with a skirt 46 at the lamp-receiving side (see FIGS. 2 and 3) and a dome dimple 47 at the other end for accommodating the tipped off end of the lamp. The illustrated reflector panels 40 and 41 also are provided with projections 92 which are disposed on the front face 102 of each panel between the cavities 11' etc. along the lamp-receiving edge. The projections 92 fit through openings 94 in the front face of housing member 36. The conductive metal coating is applied, such as by aluminizing, to at least the outer surfaces of front face 102, cavities 11', etc., and sidewalls 104–112. The bottom edges and undersides of all these surfaces typically are masked so that they are not metallized.

Figure 4:
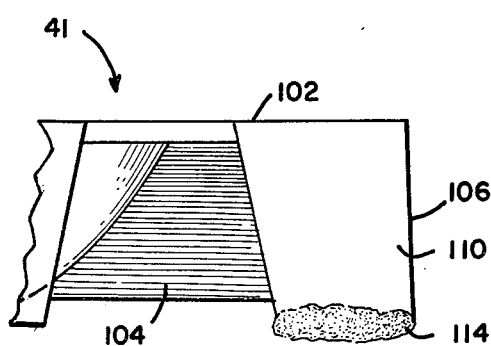
FIG. 4 is an enlarged fragmentary detail view of one end of the reflector panel of FIG. 3 showing the conductive paste coating thereon.

In accordance with the invention, as shown in FIGS. 3–5, a quantity of electrically conductive dried paste material 114 is disposed at and about the interface between the bottom edge of each of the reflecting sidewall portions 110 and 112 and a respective area 116 of an electrical "ground" or common circuit conductor run 50 on the circuit board. When the unit is assembled, the conductive reflector sidewall portions 110 and 112 are vertically aligned with the respective conductive "ground" areas 116 (as best shown in FIGS. 3 and 5), and the conductive paste 114 serves to provide a low voltage electrical path between the conductive reflector and the common circuit conductor. Conductor run 50 includes, or is connected to, the terminals 31 and 31', and is connected in common and makes contact with one of each of the pairs of connector eyelets for each of the lamps 11, etc. Accordingly, by virtue of the electrical path provided by the conductive paste 114 locations, the reflector panels 40 and 41 additionally function as an electrically grounded shield, as generally described in the aforementioned flip flash patents. Further, the conductively coated projections 92 provide static grounding protection for the unit by assuring electrical contact with any charged object, such as a user's hand, which may touch the front of the array housing. A basic arrangement of this type is described in co-pending application Ser. No. 724,792, filed Sept. 20, 1976 and assigned to the present assignee.

As further described in U.S. Pat. Nos. 3,894,226 and 4,017,728, the circuitry on circuit board 43 includes radiation switches (not shown) which are in contact with and bridge across circuit runs that are connected to them. In a preferred circuit arrangement described in the aforementioned co-pending application Ser. No. 860,759, the five lamps 11–15 are arranged in parallel across the input terminals 31 and 32, and four normally closed radiant-energy activated disconnect switches (not shown) are connected in series with a respective one of the lamps 11–14. For example, each disconnect switch may comprise a length of electrically conductive heat shrinkable polymeric material which is attached to the circuit board at both ends, with its midportion suspended across an aperture in the board. Each disconnect switch is responsive to the flashing of a lamp with which it is series connected to form an open circuit. The circuit also includes four normally open radiant-energy-activated connect switches (not shown) for providing sequential flashing of the lamps 11–15 in response to firing pulses successively applied to the input terminals 31 and 32. The material for the connect switches may be suitable material initially having an open circuit or high resistance, the resistance thereof becoming zero or of a low value when the material receives radiation in the form of heat and/or light from a respective adjacent lamp upon the lamp being flashed. For example, circuit terminals on board 43 may be bridged by a patch of a dried paste of silver oxide dispersed in a binder, such as polyvinyl resin. For the above purposes, each of the connect switches and disconnect switches is respectively positioned behind and near to a flashlamp 11, 12, 13, 14. Window means in the form of transparent sections or the illustrated openings 51 are provided in the reflector cavities in front of the switches to facilitate radiation transfer. Accordingly, as illustrated, the openings 51 are somewhat elongated to accommodate radiation transfer for both the indicators and switches. In addition, the sheet of insulating material 42, which is disposed between the reflector panels and the printed circuitry, is of a material which is transparent to the lamp radiations. To further enhance transfer to the connect switches, the interposed sheet of insulating material 42 contains very small openings 84 (FIG. 6), each of which is alignment with the midportion of a respective one of the disconnect switch strips when the sheet 42 is assembled with the circuit board 43.

As previously mentioned, terminals 31 and 31' are part of a common conductor run 50 connected to one lead-in wire of each lamp. Terminal 32, on the other hand, is part of a signal circuit conductor run 51 connected through a disconnect switch to the other lead-in wire of lamp 11 and to an associated connect switch. In like manner, terminal 32' is part of a signal circuit conductor 51' connected through a disconnect switch to the other lead-in wire of lamp 21.

As has been explained, the lower portion of the circuit board contains a substantially reverse mirror image of the circuit on the upper part of the circuit board. The circuit runs from the plugged-in terminals at the lower part of the circuit board and extends upwardly so as to activate the circuitry in the upper half of the circuit board. Similarly, when the unit is turned around and tab 16' is plugged into a socket, the circuit board terminals will be connected to and activate the lamps which will then be in the upper half of the circuit board, and hence in the upper half of the flash unit. This accomplishes, as has been stated, the desirable characteristic whereby only the group of lamps relatively farthest away from the camera lens axis will be flashed, thereby reducing the undesirable "red-eye" effect.

In a manner generally similar to that described in the aforementioned flip-flash patents, the array functions as follows. Assuming that none of the five lamps in the upper half of the unit have been flashed, upon occurrence of the first firing pulse applied across the terminals 31 and 32, this pulse will be directly applied to the lead-in wires of the first connected flashlamp 11, whereupon the lamp 11 flashes and becomes an open circuit between its lead-in wires. Heat and/or light radiation from the flashing first lamp 11 causes the adjacent first connect switch to become a closee circuit (or a low value of resistance), thereby connecting the circuit board terminal electrical to a lead-in wire of the second lamp 12, and causes the adjacent first disconnect switch to open, removing lamp 11 from the circuit. By the time this occurs, the firing pulse has diminished to a value insufficient to cause the second lamp 12 to flash. When the next firing pulse occurs, it is applied to the lead-in wires of the second lamp 12 via the new closed connect switch, whereupon the second lamp flashes, thereby causing an adjacent second connect switch to assume zero or low resistance, and the second lamp 12 now has an open circuit or high resistance between its lead-in wires. The associated second disconnect switch opens to remove lamp 12 from the circuit. When the next firing pulse occurs, it is applied via the now closed second connect switch to the third lamp 13, thereby firing the lamp which becomes an open circuit, and the radiation from it causes an adjacent third connect switch to become essentially a closed circuit across its terminals. The adjacent third disconnect switch removes lamp 13 from the circuit. Thus the next firing pulse will be applied via the now closed third connect switch to the lead-in wires of the fourth flashlamp 14, thereupon causing that lamp to flash. The fourth lamp then becomes an open circuit, and the radiation from it causes an adjacent fourth connect switch to become essentially a closed circuit across its terminals. The fourth disconnect switch opens to remove lamp 14 from the circuit. The next (fifth) firing pulse will be applied via the now closed fourth connect switch to the lead-in wires of the fifth flashlamp 15, thereupon causing the last lamp of the group 17 to flash. A larger opening 85 is provided in sheet 42 behind lamp 15 to assure sufficient radiation transfer to activate the last flash indicator (not shown) at the top end of the array. A corresponding opening 85 (not shown) is located behind lamp 25. When the flash unit is turned around and the other connector tab 16' attached to the camera socket, the group 18 of lamps that then become uppermost and relatively farthest away from the lens axis will be in the active circuit and will be flashed in the same manner as has been described. In a preferred embodiment, the lamps 11, etc., are high voltage types requiring about 2,000 volts, for example, at low current for flashing, and they can be fired by impacting or stressing a piezoelectric element in the camera.

Now again referring to the electrically conductive paste material 114, in general it may comprise a conduction-promoting particulate material mixed with a binder. For example, a particulate such as conductive carbon, metal powders, metal-coat glass beads, etc., may be employed. Preferably, however, the composition of the conductive paste 114 is the same as the composition of the electrically conductive pattern (e.g. conductor run 50) on the surface of circuit board 43. This provides a positive and environmentally stable grounding path in accordance with the invention, whereby the material 114 adheres to the conductive reflector and is compatible with the conductive material of the circuit pattern on board 43.

In one specific automated assembly process, the circuitry is provided on circuit board 43 by preparing a circuit paste comprising a mixture of silver flakes, glass beads, an acrylic binder, and a quantity of solvent. For example, a specific circuit paste composition we have employed comprises a wet mixture of 64.5% Dupont #4929 screening paste (70% silver flake and 30% acrylic binder as vehicle), 27.7% glass beads, and 7.78% butyl cellosolve acetate. The circuit paste is then silkscreened as a circuit pattern on a surface of the circuit board 43. The connect and disconnect switches are applied to the circuit board. Eye-lets 11a', 11b', etc. are inserted in holes provided therefor in the circuit board, and insulating sheet 42 is placed over the surface of the board. Lamps 11, etc. are connected to the circuitry by mounting their respective lead-in wires into respective pairs of eyelets via holes in sheet 42 and crimping and/or bending the eyelets to secure the lamp leads to the circuit. One lead-in wire of each lamp is connected to common conductor 50. A wet paste of electrically conductive material 114 is then applied to the bottom edges of each of the reflector sidewall portions 110 and 112; for example, see FIG. 4 showing the coated edge of portion 110. The wet paste 114 is preferably the same mixture as the circuit paste with an additional quantity of solvent to provide a thinner consistency for application to the reflector. The coating of paste 114 must be comparatively thin so as not to interfere with the close placement of the reflector panels 40 and 41 and so as not to cause shorting between closely placed circuit board conductors. A specific paste 114 composition we have employed comprises a wet mixture of 90% of the above-described circuit paste (Dupont #4929, glass beads and butyl cellosolve acetate) and 10% butyl cellosolve acetate. The reflector panels are then inserted between the lamp and circuit board, as illustrated in FIG. 2, with the wet paste disposed at the interface between the bottom edges of reflector sidewall portions 110 and 112 and common circuit conductor areas 116, as best shown in FIGS. 3 and 5. The assembly is enclosed in the front and back housing members 36 and 37, and paste 114 is allowed to dry so that it joins the reflector unit to the common conductor areas 116 at the interfaces therebetween.

The paste 114 may be allowed to dry before assembling the reflector panels to the lamp-circuit board subassembly, but best results are obtained if the paste is wet because it then becomes integral with both the reflector and the common conductor.

Figure 7:
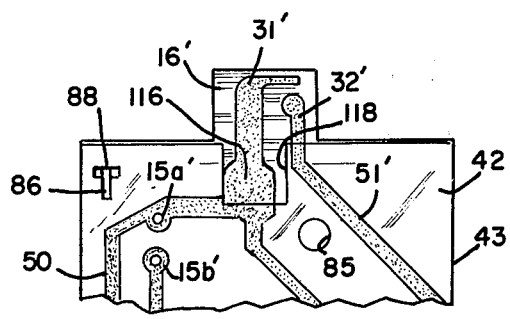
FIG. 7 is a fragmentary front elevation of one end of the circuit board used in the unit of FIG. 1 with the insulating sheet of FIG. 6 disposed thereon and having a slot therein according to the invention.

In order to assure ready alignment and contact between the paste-coated reflector sidewalls 110 and 112 and the respective common conductor areas 116, the areas 116 may be enlarged with respect to conductor run 50 (and even terminal 31 or 31') as shown in FIGS. 2 and 7. In this event, it is useful to have an opening, such as slot 118, in the insulating sheet 42 in alignment with the respective reflector sidewall portion 110 or 112 and the conductive area 116 whereat the interface coated with paste 114 is disposed (see FIGS. 2, 6 and 7). In this manner, the insulating sheet 42 masks the signal circuit conductor 51' (or 51) from the paste coated sidewalls of the reflector panels to avoid inadvertent shorting. As described in the aforementioned copending application Ser. No. 861,652 Sindlinger et al, the sheet 42 is typically a few thousandths of an inch thick and made of plastic, such as cellulose acetate or polyethylene terephthalate resin (available as Mylar polyester film, Mylar being a registered trademark of E. I. du Pont de Nemours and Co.). In accordance with the Sindlinger et al application, the sheet 42 can be located and secured on the circuit board 43 by tabs 86 (one being shown in FIGS. 2, 6 and 7) in the insulating sheet which interlock with slots 88 (one being shown in FIGS. 2 and 7) in the circuit board.

Figure 8:
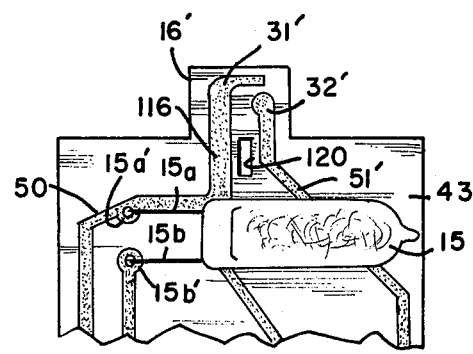
FIG. 8 is a fragmentary front elevation of an alternative embodiment of the circuit board used in the unit of FIG. 1 having a slot between adjacent terminal conductors according to the invention.

Al alternative approach for providing the above-mentioned anti-shorting protection in a photoflash assembly which does not employ an insulating sheet 42 is shown in FIG. 8. A slot 120 is provided at each end of the circuit board and located between the signal conductor 51' (or 51) and the area 116 of the common circuit conductor adjacent to terminal 31' (or 31). In this manner, the slot 120 prevents smearing of the reflector paste 114 between the common and signal circuit conductor runs. In FIG. 8, the area 116 is illustrated as having the same width as the vertical portion of terminal 31'.

Although the present invention has been described with respect to specific embodiments, it will be appreciated that modifications and changes may be made by those skilled in the art without departing from the true spirit and scope of the invention.

What we claim is:

1. A photoflash unit comprising a plurality of electrically ignitable flashlamps each having a pair of lead-in wires, a circuit board having circuitry disposed on a surface thereof for selectively igniting said flashlamps, said flashlamps being positioned over said surface, means electrically connecting the lead-in wires of said flashlamps to said circuitry, said circuitry including a common circuit conductor connected electrically to one lead-in wire of each of said flashlamps, said common circuit conductor including an enlarged conductive area on said circuit board, an electrically conductive reflector unit positioned between said lamps and said circuit board and shaped to reflect light from said lamps when flashed, said reflector unit including a sidewall portion vertically aligned with said enlarged conductive area, and means for providing a low voltage electrical path between said conductive reflector unit and said common circuit conductor, said last-mentioned means comprising a dried paste of electrically conductive material disposed between the edge of said sidewall portion of the conductive reflector unit and said enlarged conductive area on the circuit board.

2. The photoflash unit of claim 1 further including a sheet of electrically insulating material interposed between said reflector unit and said circuit board, said insulating sheet having an opening in alignment with said sidewall portion of the reflector unit and said enlarged conductive area whereat said conductive paste is disposed.

3. The photoflash unit of claim 2 wherein said circuit board has a tab at one end with first and second terminals thereon, said first terminal being connected to said common circuit conductor, said second terminal being connected through a signal circuit conductor to the other lead-in wire of a selected one of said lamps, said enlarged conductive area being located adjacent to said first terminal, and said opening in said insulating sheet comprises a slot at one end thereof whereby said insulating sheet masks said signal circuit conductor from said reflector unit.

4. The photoflash unit of claim 1 wherein said circuit means comprises a circuit board having a tab at one end with first and second terminals thereon, said circuitry is disposed on a surface of said circuit board, said flashlamps are positioned over said surface, said first terminal on said tab is connected through a signal circuit conductor to the other lead-in wire of a selected one of said lamps, said reflector unit includes a sidewall portion vertically aligned with an area of said common circuit conductor adjacent to said first terminal, said conductive paste material is disposed between the edge of said sidewall portion of the conductive reflector unit and said area of the common circuit conductor adjacent the first terminal, and a slot is located in said circuit board between said signal circuit conductor and said area of the common circuit conductor adjacent the first terminal.

5. A method of making the photoflash unit of claim 1 comprising the steps of:
providing circuit means containing ignition circuitry including a common circuit conductor;
connecting a plurality of flashlamps to said circuitry each by means of a pair of lead-in wires depending therefrom, one lead-in wire of each of said lamps being connected to said common circuit conductor;
applying a wet paste of electrically conductive material onto a portion of an electrically conductive reflector unit;
positioning said reflector unit between said lamps and said circuit means with said wet paste on the reflector disposed at an interface between said reflector unit and said common circuit conductor; and
allowing said paste to dry whereby said conductive paste joins said reflector unit to said common circuit conductor at said interface therebetween.

6. The method of claim 5 wherein said circuit means comprises a circuit board; said circuitry is provided on said circuit board by preparing a circuit paste comprising a mixture of a conduction-promoting particulate material, a binder, and a quantity of solvent, and silk-screening said circuit paste as a conductive pattern on a surface of said circuit board; and the wet paste applied to said reflector unit comprises the same mixture as said circuit paste with an additional quantity of solvent to provide a thinner consistency for application to the reflector.

7. A method of making the photoflash unit of claim 1 comprising the steps of:
providing circuit means containing ignition circuitry including a common circuit conductor;
connecting a plurality of flashlamps to said circuitry each by means of a pair of lead-in wires depending therefrom, one lead-in wire of each of said lamps being connected to said common circuit conductor;
applying a wet paste of electrically conductive material onto a portion of an electrical conductive reflector unit;
allowing said paste to dry; and
positioning said reflector unit between said lamps and sad circuit means with said dried conductive paste on the reflector disposed at an interface between said reflector unit and said common circuit conductor, whereby said dried conductive paste provides a low voltage electrical path between said conductive reflector unit and said common circuit conductor.

8. A photoflash unit comprising a plurality of electrically ignitable flashlamps each having a pair of lead-in wires, circuit means containing circuitry for selectively igniting said flashlamps, means electrically connecting the lead-in wires of said flashlamps to said circuitry, said circuitry including a common circuit conductor connected electrically to one lead-in wire of each of said flashlamps, an electrically conductive reflector unit positioned between said lamps and said circuit means and shaped to reflect light from said lamps when flashed, said reflector unit including a sidewall portion vertically aligned with an area of said common circuit conductor, and means for providing a low voltage electrical path between said conductive reflector unit and said common circuit conductor, said last-mentioned means comprising a dried paste of electrically conductive material coated on said sidewall portion of the reflector unit at an interface between said reflector unit and common circuit conductor.

9. The photoflash unit of claim 8 wherein said circuit means comprises, an elongated circuit board having a tab at each end of two opposite ends thereof with first and second terminals on each of said tabs, said circuitry is disposed on a surface of said circuit board, said flash lamps have tubular envelopes and are arranged in a planar array of two parallel columns with the lamps horizontally disposed and positioned over said surface of the circuit board, said first terminal on each of said tabs is connected to said common circuit conductor, said second terminals on said tabs being connected through respective signal circuit conductors to the other lead-in wire of respective selected lamps, said photoflash unit further includes a second electrically conductive reflector unit which together with said first-mentioned reflector unit forms a multiple reflector system comprising a pair of adjacent strip like reflector panels each associated with a respective one of said columns of lamps and having a column of side-by-side lamp-receiving cavities on its front side formed with reflecting surfaces which respectively are aligned behind the lamps associated therewith, each of said reflector panels including sidewall portions at each end thereof which are vertically aligned with respective areas of said common circuit conductor adjacent to respective ones of said first terminals, and said conductive paste is disposed between the edges of said sidewall portions of the reflector panels and said respective areas of the common circuit conductor adjacent respective first terminals.

10. The photoflash unit of claim 9 wherein said sidewall portions of one of said reflector panels are juxtaposed with said sidewall portions of the other of said reflector panels.

* * * * *